United States Patent [19]
Bergey et al.

[11] 3,991,553
[45] Nov. 16, 1976

[54] LOW VOLTAGE BATTERY INDICATOR FOR A SOLID STATE WATCH

[75] Inventors: John M. Bergey; Arthur H. O'Connor, both of Lancaster, Pa.

[73] Assignee: Time Computer, Inc., Lancaster, Pa.

[22] Filed: Oct. 31, 1974

[21] Appl. No.: 519,637

[52] U.S. Cl. .............................. 58/23 BA; 58/50 R; 58/152 H; 340/248 B
[51] Int. Cl.² .................. G04C 3/00; G04B 19/30; G04B 37/12; G08B 21/00
[58] Field of Search ............ 58/23 R, 23 BA, 50 R, 58/152 H; 340/248 R, 248 A, 248 B, 249

[56] References Cited
UNITED STATES PATENTS

| | | | |
|---|---|---|---|
| 3,532,968 | 10/1970 | Overlie | 340/249 X |
| 3,672,155 | 6/1972 | Bergey et al. | 58/50 R |
| 3,678,499 | 7/1972 | McCarty | 340/336 |
| 3,760,584 | 9/1973 | Dargent | 58/50 R |
| 3,832,629 | 8/1974 | Cernek | 340/248 D |
| 3,866,406 | 2/1975 | Roberts | 58/4 A |
| 3,898,790 | 8/1975 | Takamune et al. | 58/50 R |

*Primary Examiner*—E. S. Jackmon
*Attorney, Agent, or Firm*—LeBlanc & Shur

[57] ABSTRACT

Disclosed is a solid state wristwatch having a digital light emitting diode display and a low battery voltage circuit for actuating the display to indicate the approach of battery failure. The battery voltage sensing circuit draws power only when the display is energized and causes one of the display stations to blink. It comprises a silicon band gap reference voltage circuit for comparing the battery voltage with a reference voltage that is independent of temperature and battery voltage variations.

8 Claims, 5 Drawing Figures

LOW VOLTAGE BATTERY INDICATOR FOR A SOLID STATE WATCH

This invention relates to battery operated wristwatches and more particularly to a solid state wristwatch which automatically indicates when the wristwatch battery is approaching its exhaust capacity level.

Battery powered wristwatches are well known and recent years have seen the development of the the battery operated solid state wristwatch. Watches of this type generally employ a quartz crystal oscillator of substantially constant frequency as the time standard. They are generally provided with an electro-optic digital display most often in the form of liquid crystals or light-emitting diodes.

While the advantages of battery operated watches and clocks are well known, the fact that they are powered by a supply of unknown remaining capacity can be annoying and even troublesome. That is, a wristwatch, whether it is of the conventional spring type or battery operated often represents a very personal attachment to most of those who own and wear them. Personal dependency for timekeeping performance becomes increasingly important as the watch wearer is separated from a convenient alternate source of time measurement or watch repair. With a conventional watch, the owner simply winds the mainspring daily, either manually or automatically through wearing, and his timepiece continues to function properly. If the owner or wearer is away on a trip, vacation or the like, he remains relatively uneffected.

This however is not the case with the battery driven watch, since the battery can run down and if the wearer is not forewarned, he will be without a personal time measurement until a replacement battery cell or cells can be located. Depending upon whether or not he has ready access to replacement cells, the unexpected loss of function of his personal timepiece can range from simply annoying to very troublesome.

Although watches having active displays, such as light-emitting diodes, give an indication of battery failure by a dimming or outright disappearance of the display, the dimming of the display occurs quite rapidly and only after the battey capacity is substantially completely exhausted. It does not give sufficient advance warning. For this reason, in the trade, it is customary to note or mark the installation date of a fresh battery and, knowing the approximate life of the battery, to replace it on a strictly time dependent basis, such as yearly. The problem with this approach is that manufacturing tolerances result in significantly different drain rates and shelf lives for the cells, so that the capacities of the cells are noticeably different at the time of installation.

The present invention is directed to the feature of incorporating in the wristwatch a circuit which senses when the end of the watch battery life approaches and automatically produces an indication of this fact to the watch wearer. The circuit detects a predetermined battery voltage level which, when reached, clearly indicates that battery life is rapidly approaching its exhausted capacity level. When this level has been reached, the circuit actuates the rightmost digit in the solid state display, either active or passive, causing it to flash at a visible rate of 4Hz. While described in conjunction with both active and passive displays, such as the passive liquid crystal and the active light-emitting diode displays, the circuit of the present invention is particularly adapted for use with a digital light-emitting diode display. Important features of the invention include the provision in the wristwatch of a power switch which provides sensing circuit actuation only when the display is on. As a result, the voltage sensing circuit does not draw power from the battery when the light emitting diode display is unenergized. Incorporated in the circuit is a voltage and temperature stable voltage reference, a high gain comparator, and a gating circuit used to control drive information to the rightmost or last digit of the four digit display.

It is therefore one object of the present invention to provide a low voltage battery indicator for a solid state wristwatch.

Another object of the present invention is to provide an indicator in a light-emitting diode wristwatch which shows when the watch battery is approaching but has not yet reached its limit of capacity.

Another object of the present invention is to provide an indicating circuit for wristwatches having light-emitting diode display which does not draw battery energy when the display is unactuated.

Another object of the present invention is to provide a battery capacity indicator which makes the use of a portion of the wristwatch time display.

Another object of the present invention is to provide a light-emitting diode solid state wristwatch in which one of the digit stations of the display is caused to blink when the watch battery is approaching but has not as yet reached the end of its useful life.

These and further objects and advantages of the invention will be more apparent upon reference to the following specification, claims and appended drawings wherein:

Figure 1:
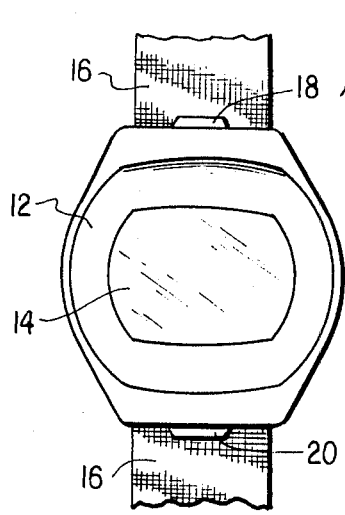
FIG. 1 is a plan view of a wristwatch and a portion of a wristwatch bracelet constructed in accordance with the present invention.

Referring to the drawings, FIG. 1 is a top plan view of a wristwatch constructed in accordance with the present invention. The watch, generally indicated at 10, comprises a non-magnetic watch case 12 having a viewing window 14. The window is preferably formed by a suitable red light filter, such as a transparent red plastic, ruby, or hard glass material. Attached to case 12 is a wristwatch bracelet 16 and mounted on the case is a pushbutton time demand switch 18. Also mounted on the watch case at the edge opposite from the time demand switch 18 is a similar date switch 20. Pushbuttons 18 and 20 are preferably of identical construction and carry permanent magnets so that when they are depressed, reed switches inside the watch case are actuated. In the preferred embodiment, the pushbutton switches take the form disclosed in assignee's copending application Ser. No. 481,331, filed June 20, 1974, but may also be of the type described in assignee's U.S. Pat. No. 3,782,102.

Figure 2:
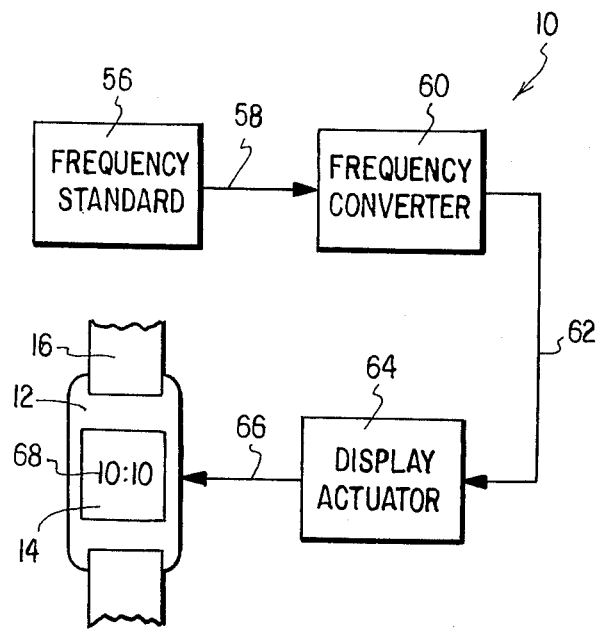
FIG. 2 is a simplified block diagram of the electrical circuit for the timekeeping portion of the wristwatch of this invention.

FIG. 2 is a simplified block diagram of the principal timekeeping components of the watch of the present invention. These comprise time base or frequency standard 56, preferably in the form of a crystal oscillator producing an electrical output on lead 58 at a frequency of 32,768Hz. This relatively high frequency is supplied to a frequency converter 60 in the form of a divider which divides down the frequency from the standard 56 so that the output from the converter 60 appearing on lead 62 is at a frequency of 1 Hz. This signal is supplied to a display actuator 64 which in turn drives an electro-optical display indicated at 68 and viewable through window 14 by way of electrical lead 66. While only an hours and minutes display is shown in FIG. 2, it is understood that with the operation of the pushbutton 18 of FIG. 1, the hours and minutes are first displayed for a predetermined time and if the pushbutton 18 remains depressed, the hours and minutes are extinquished and the seconds become visible. The same display diodes are used for both minutes and seconds, since these are not displayed simultaneously, thus minimizing the power drain from the watch battery. In the preferred embodiment, if the pushbutton 18 remains depressed at the end of 1¼ seconds, the hours and minutes of the display are extinguished, i.e., they disappear and simultaneously the seconds reading is displayed through the window 14 by the same diodes which previosuly displayed the minutes.

Pushbutton 18 is a read switch or a demand switch which is depressed when the wearer desires the time to be displayed. As seen in FIG. 1, the watch 10 incorporates a second pushbutton switch 20 identical in construction and hereafter referred to as the date switch. When the pushbutton 20 of the date switch is depressed, the day of the month, month of the year, and the AM or PM of time are displayed by the same diodes that display time in response to depression of pushbutton 18. Again the display is timed for 1¼ seconds, the only difference being that the date display, i.e., day, month and AM or PM of time, is extinguished at the end of 1¼ seconds, irrespective of whether or not pushbutton 20 has previously been released or is still depressed.

Figure 3:
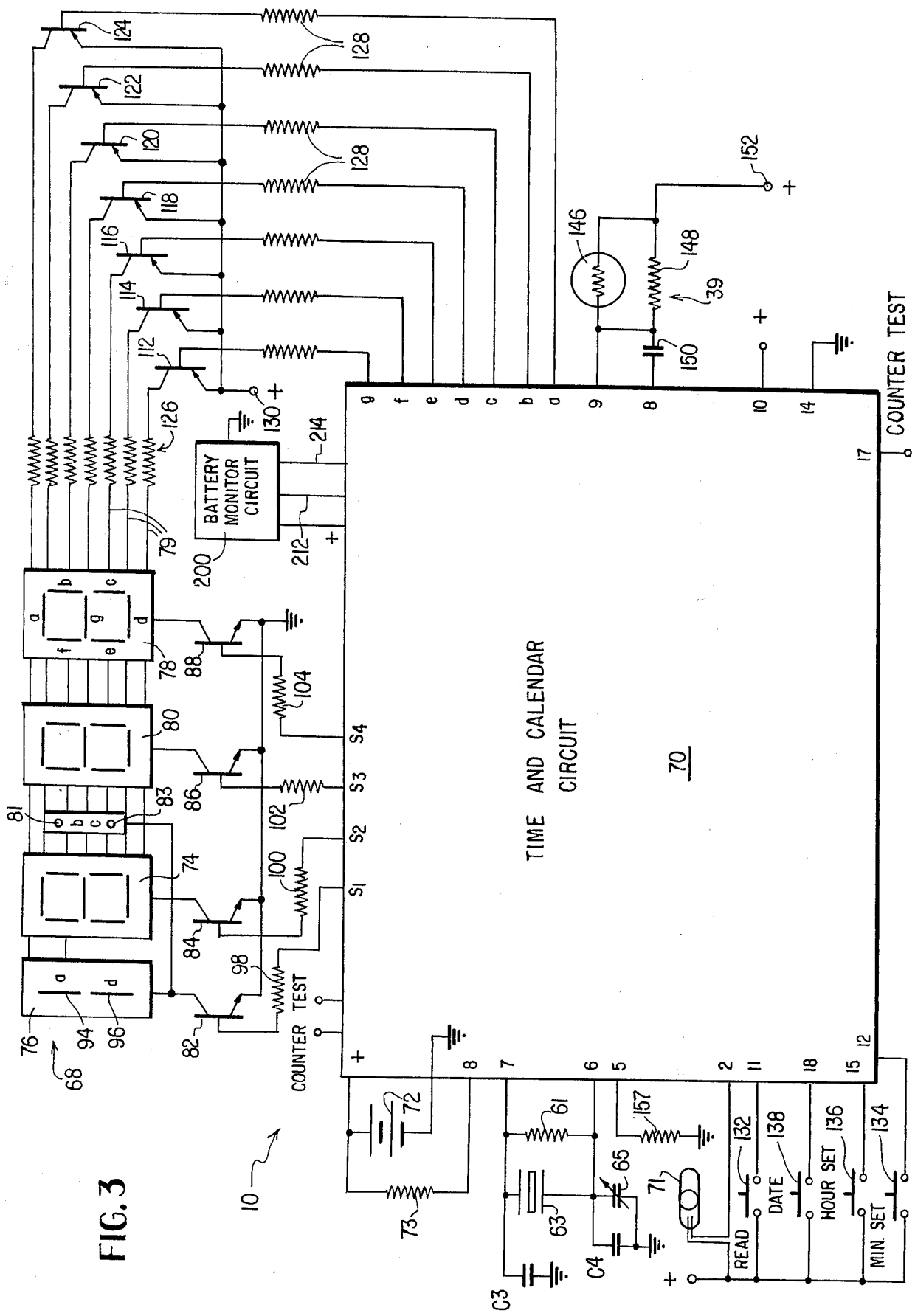
FIG. 3 is an overall electrical circuit diagram of the watch of the present invention showing the time and calendar circuit in block form as a large scale integrated CMOS chip.

FIG. 3 is an overall circuit diagram of the wristwatch of this invention. The watch comprises a large scale integrated circuit 70 preferably in the form of a single integrated circuit chip formed entirely of complementary symmetry MOS transistors. Circuits of this type are presently availabe from RCA, Hughes Aircraft Corporation, and others. In addition to the large scale integrated circuit 70, the watch comprises a battery 72 which, by way of example only, may comprise a conventional three-volt wristwatch battery formed from two 1½ volt cells connected in series. The battery energizes the light-emitting diode display 68, which is shown in FIG. 3 as consisting of a pair of hours stations comprising the digit station 74 and tens station 76, and a pair of combination minutes and seconds stations comprising the digit station 78 and tens station 80. The display 68 also includes a pair of colon dots 81 and 83, each formed by a single light-emitting diode. Station 78 is formed of a seven bar segment array including the light emitting diode segments labeled a through g. Stations 74 and 80 are of identical construction whereas the hours tens station 76 is formed from two light emitting diode bar segments 94 and 96. The display stations are energized from integrated circuit 70 connected to battery 72 by way of a plurality of leads 79 to the anodes of the light-emitting diodes and the cathodes of the light-emitting diodes are individually connected to the other side of the power supply through strobing or switching NPN junction transistors 82, 84, 86, and 88.

There is a separate lead 79 for the total number of bar segments in a display station and these leads are connected to a corresponding a through g segment of each of the stations 74, 78, and 80. That is, with a seven bar segment display, there are seven leads 79. However, all of the cathodes of each station are connected in common through the NPN junction transistor for that display. The two bar segments 94 and 96 for the hours tens display have their cathodes connected to the transistor 82 as do the colon dots 81 and 83. All the cathodes of hours units station 74 are connected to transistor 84. Display stations 78 and 80 are used to display both minutes and seconds and station 80 has the cathodes of all diodes connected to the transistor 86, and all cathodes of display station 78 are similarly connected to transistor 88. These transistors have their bases returned to the integrated circuit 70 through current limiting resistors 98, 100, 102 and 104, the emitters of the transistors being connected in common to ground, i.e., the negative side of the power supply battery 72, as indicated at 110.

The anodes of the bar segment diodes are energized from the bipolar driver transistors 112, 114, 116, 118, 122, and 124. Since the greatest number of bar segments in any display station is 7, there are seven driver transistors and seven leads 79. The transistor collectors are connected to the display diodes through individual ones of current limiting resistors 126 and the driver transistor bases are connected to the integrated circuit 70 through protective resistors 128. The emitters of the driver transistors are connected in common to the positive side 130 of power supply battery 72. The PNP segment driver transistors are preferably formed from a transistor as are the NPN strobing transistors.

The crystal oscillator or frequency standard 56 of FIG. 2 by way of example only, may be of the type disclosed in assignee's U.S. Pat. No. 3,760,584. The components of this oscillator in FIG. 3 external to the large scale integrated circuit 70 are the crystal 63, the variable capacitor 65, (tuning capacitor or trimmer), bias resistors 61, 73, and 157, and the two $\pi$ network feedback capacitors C3 and C4, as illustrated. The circuit of the patent is modified in the preferred embodiment to the extent that, in FIG. 3, the variable capacitor 65 is connected in parallel with grounded feedback capacitor C4. The remaining portions of the oscillator 56 are incorporated in the integrated circuit 70. Also external to the integrated circuit is a demand or time read switch 132, which is closed when the button 18 of FIG. 1 is depressed. Further manually operated switches external to the integrated circuit 70, are the minute set switch 134 and hour set switch 136. These switches are connected between the positive side of the battery 72 and the time computer circuit 70.

In the watch of the present invention, the intensity of the light emitted from the display diode is varied in accordance with the ambient light. That is, the diode light intensity is increased for greater contrast when the ambient light is bright, such as during daytime display, whereas the intensity of the light from the diode is decreased when ambient light decreases.

The automatic display intensity control circuitry is generally indicated at 39 in FIG. 3 and comprises a photosensitive resistor 146 suitably mounted on the face of the watch connected to the positive side of battery 72 and to a resistor 148 and a capacitor 150. Additional switches external to the integrated circuit 70 are the date switch 138 which is closed in response to the button 20 of FIG. 1 and the inertial switch 71 in parallel with read switch 132.

In the present invention, the same display stations 74, 76, 78, and 80 (and colon dots) are utilized to provide a calendar display for displaying the date, month and AM or PM of time. The month in decimal number form is displayed on stations 74 and 76, the day of the month in decimal number form on stations 78 and 80. Illumination of colon dot 81 indicates AM of time and illumination of colon dot 83 is used to indicate PM of time. The calendar portion of the circuit is also incorporated into LSI chip 70 and the calendar information is displayed in response to depression of button 20 in FIG. 1. For a detailed discussion of the operation of the time and calendar circuit 70 of this invention, reference may be had to assignee's copending application Ser. No. 504,734, filed Sept. 10, 1974, the disclosure of which is incorporated herein by reference.

Figure 4:
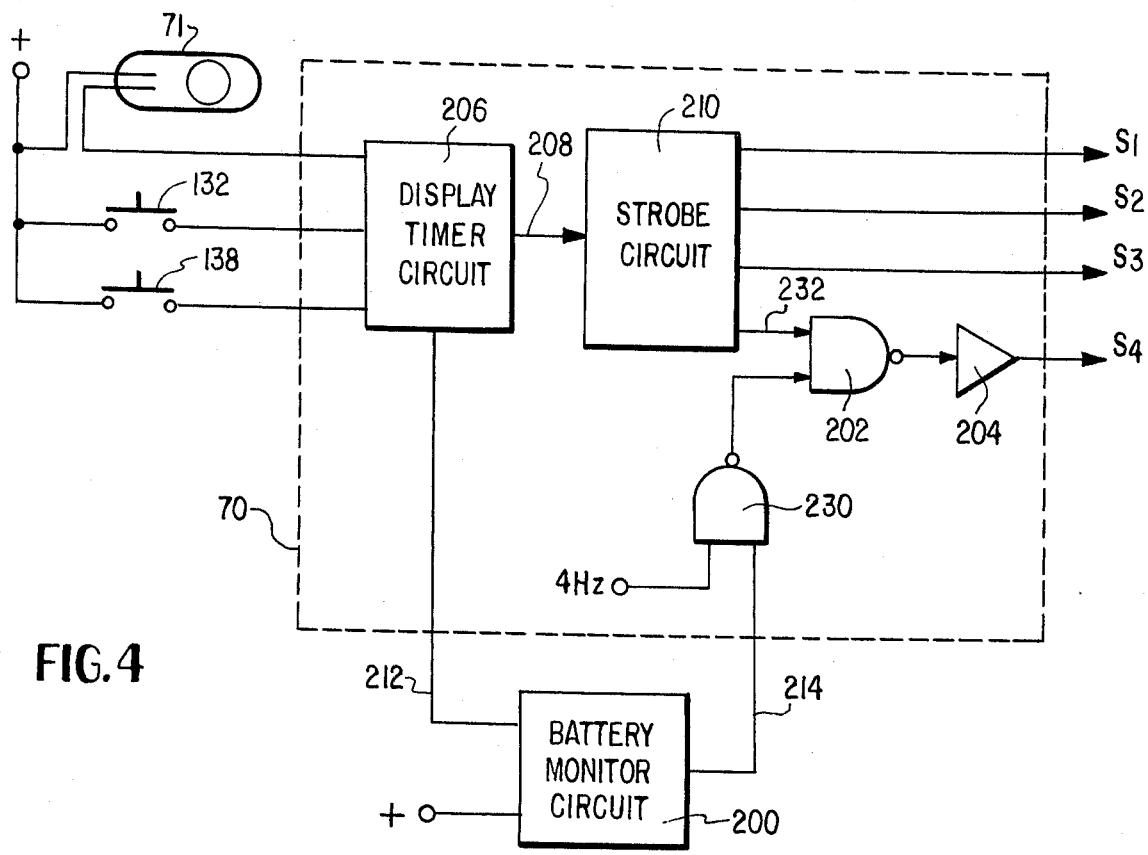
FIG. 4 is a simplified block diagram showing that portion of the time and calendar circuit of FIG. 3 relating to the battery monitor circuit of this invention.

FIG. 4 shows that portion of the large-scale integrated circuit chip 70 relating to the battery monitor 200 of the present invention along with associated elements. The integrated circuit 70 is identical to the circuit shown in assignee's copending application Ser. No. 504,734, filed Sept. 10, 1974, with the exception that added to it are the CMOS NAND gates 202 and 230 and a CMOS non-inverting buffer amplifier 204. These elements are formed of complementary symmetry MOS transistors and are incorporated directly into the chip 70.

Also forming a part of the large scale integrated circuit chip is a display timer 206 connected to the inertial switch 71, read switch 132, and date switch 138. This timer is of the type shown, for example, in U.S. Pat. No. 3,760,584 and comprises a flip-flop which is set by a positive pulse resulting from closure of one of the switches 71, 132 or 138. As described in the patent, the flip-flop is reset after 1¼ seconds by a delay counter connected to the divider. The display timer circuit 206 is in turn connected by a lead 208 to a strobe circuit 210. This strobe circuit produces the strobe signals S1, S2, S3 and S4, for the transistors 82, 84, 86 and 88 of FIG. 3. The display stations have their circuits completed by conduction of these transistors in sequence such that the hours tens station 76 is first energized (along with the colon dots), then station 74, next station 80 and finally station 76. The date display is of course strobed by these same transistors in the same sequence. The battery monitor circuit 200 in FIG. 4 receives an output from the display timer circuit 206 by way of a lead 212 and is in turn connected to AND gate 202 by way of a lead 214. When the battery monitor circuit senses a low battery voltage and the display has been actuated as indicated by an output from display timer circuit 206 on the lead 212, the battery monitor circuit acts to produce a 4Hz blinking signal on strobe lead S4 to blink the rightmost digit or display station 76 at the readily discernible 4Hz rate.

Figure 5:
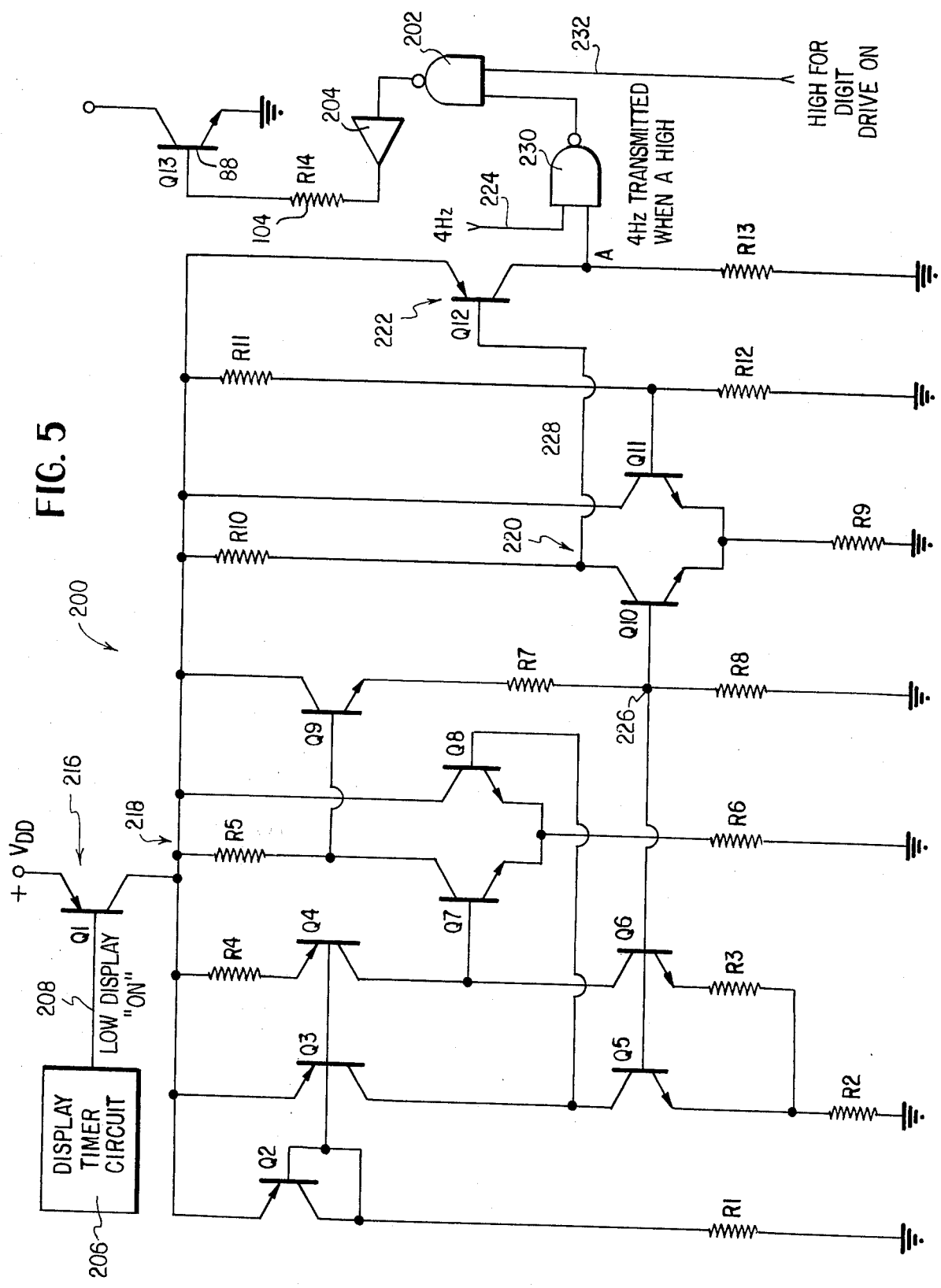
FIG. 5 is a detailed circuit diagram of the battery monitor circuit and related elements of FIG. 4.

FIG. 5 is a detailed circuit diagram of the battery monitor circuit 200 and shows associated elements with like parts bearing like reference numerals. In general, it comprises a display ON switch generally indicated at 216, a reference voltage generator generally indicated at 218, a voltage comparator 220, and a high gain amplifier 222. The 4Hz blinking signal is taken from the binary frequency divider or frequency converter 60 of FIG. 2 by way of a lead 224. The transistor switch 216 acts as an enabling device which senses when the display is on and provides power to the battey monitor circuit only during display on time, thereby conserving battery energy. The voltage reference generator circuit 218 is constructed to be temperature and supply voltage independent.

The enable switch is formed in FIG. 5 by transistor Q1 connected to the positive side of the power supply battery as indicated by the terminal $V_{dd}$. The reference voltage generator circuit comprises transistors Q2, Q3, Q4, Q5, Q6, Q7, Q8, and Q9. A temperature and battery voltage independent reference voltage appears at junction 226 and this is applied to the base of transistor Q10. The transistors Q10 and Q11 form a voltage comparator. The output of the voltage comparator is applied by way of a lead 228 to the base of transistor Q12 which forms the high gain amplifier 222. A signal developed across resistor R13 at junction A is applied as one input to a NAND gate 230 which receives at its other input by way of lead 224 the 4Hz signal from the divider. The conventional strobe signal for the rightmost digit or station is supplied from the strobe circuit 210 of FIG. 4 to one input of NAND gate 202 by way of a lead 232 whereas the other input of NAND gate 202 is connected to the output of NAND gate 230.

In operation, as the output from the display timer circuit 206 in the CMOS chip at it appears on lead 208 goes low, it provides a drive current to the base of transistor Q1 when the display is on. With base current supplied, Q1 saturates and the supply voltage line for the battery monitor circuit is essentially brought to $V_{dd}$ less the saturation voltage drop of Q1. Transistors Q2 through Q9 are in the form of a band-gap voltage reference circuit. They provide a temperature independent voltage reference that is also well regulated versus supply voltage input in a well known manner. However, the circuit 218 is modified from conventional band-gap voltage reference circuits, in that Q5, Q6 are supplied with different currents but have identical geometries. The circuit operation is such that the base-emitter voltage drops of Q5 and Q6 are different but track identically with temperature, i.e., the base-emitter voltage drop is described by the equation:

$$\Delta VBE = \frac{KT}{Q} \times Ln \frac{I_5}{I_6}$$

where:
  $\Delta VBE$ = the difference in base-emitter voltage drops of transistors Q5 and Q6
  $K$ = Boltzman constant
  $T$ = Temperature in degrees Kelvin
  $Q$ = the charge on an election $Ln(I_5/I_6)$
    = the natural log of the ratio of the emitter current densities of transistors Q5 and Q6.

In the circuit, Q7, Q8 and Q9 form a differential amplifier which provides a feedback forcing the bases of Q5, Q6 to be driven to a voltage level equaling the band gap voltage of silica with the proper selection of resistors R2 and R3.

That reference voltage is fed to Q10 which is one input of the voltage comparator 220. The other input of the voltage comparator is Q11 fed from the junction of R11 and R12; thereby comparing the variations in $V_{dd}$ with the voltage reference at the input of Q10. Transistor Q12 is used as a high gain amplifier. When the battery voltage divided down to the input of Q11 exceeds the voltage reference of 1.1 volts, that is, battery in normal condition, the base of Q11 is at a higher potential than the base of Q10. In this case, Q11 conducts heavily and Q10 is turned off with no base current flowing in Q12. Resistor R13 does not have any current flow and point A is essentially at ground potential. This blocks the 4Hz signal from passing through gate 230 and the output of gate 230 is high, therefore enabling gate 202 and enabling normal digit drive information to proceed through gate 202 to the digit driver transistor 88.

When the battery voltage falls to the point where the base Q11 is at a lower potential than the base of Q10, transistor Q10 is driven into conduction and transistor Q11 into non-conduction. Base current now flows through transistor Q12 causing collector current in Q12 and bringing point A to a high potential near $V_{dd}$. With point A high, gate 230 is enabled and the 4Hz square wave is passed through to the input of gate 202. With the square wave appearing on gate 202 at 50 percent duty cycle, one input to that gate will be at ground level 50 percent of the time, thereby blocking digit drive information from reaching transistor 88 while the square wave is at this ground level. The effect of this action is to cause the last digit of the display, i.e., station 76 to blink on and off at a 4Hz rate during display on time indicating that battery voltage is low. A typical sensing level for the battery voltage which produces a blinking indication is when the battery voltage falls to or below approximately 2.4 volts.

It is apparent from the above that the present invention provides a novel circuit which in effect predicts an upcoming battery failure in a wristwatch and automatically causes one of the conventional display stations to blink at an appropriate rate so as to give an indication of impending battery failure. By proper selection of the battery voltage at which the indication is given such as, for example, 2.4 volts for a nominal 3 volt battery, it is possible to predict battery failure sufficiently in advance to give the wristwatch wearer adequate time to obtain a replacement battery.

An important feature includes the fact that the battery monitoring circuit is normally inoperative and during normal operation of the watch itself draws no power from the watch battery. It only draws power when the display is actuated by one of the demand buttons. In addition, it incorporates a circuit for generating a reference voltage (band gap voltage of silicon) which is substantially temperature independent and battery voltage independent. This is all accomplished in a relatively simplified arrangement completely compatible with a large scale CMOS integrated circuit to which it is connected.

The invention may be embodied in other specific forms without departing from the spirit or essential characteristics thereof. The present embodiment is, therefore, to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed and desired to be secured by United States Letters Patent is:

1. A solid state wristwatch comprising a source of constant frequency electrical signals, a frequency divider coupled to said source, an electro-optical digital display of light emitting diodes, a display actuator coupling said divider to said display, a battery, a manually operated demand switch for coupling said battery to said display when said display is to be energized, a low voltage circuit coupled to said display for indicating on said display when the battery is approaching the end of its useful life, means responsive to operation of said demand switch for coupling said battery to said low voltage circuit whereby said low voltage circuit draws energy from said battery only when said display is energized, said low voltage circuit comprising a band-gap voltage reference circuit for producing a reference voltage, and a comparator for comparing said reference voltage with a voltage from said battery.

2. A wristwatch according to claim 1 including a gate having a first input coupled to the output of said comparator, and a second input coupled to said divider.

3. A wristwatch according to claim 2 wherein the output of said gate is coupled to said display to provide a blinking signal from said divider to said display.

4. A wristwatch according to claim 1 including a display timer coupling said demand switch to said display and means coupling said display timer to said low voltage circuit.

5. A wristwatch according to claim 4 wherein said low voltage circuit comprises a solid state switch having a pair of controlled terminals coupling said low voltage circuit to said battery and a control terminal coupled to said display timer.

6. A wristwatch according to claim 5 wherein said demand switch comprises a time read switch.

7. A wristwatch according to claim 5 wherein said demand switch comprises a date read switch.

8. A wristwatch according to claim 5 wherein said demand switch comprises an inertial switch.

* * * * *

UNITED STATES PATENT AND TRADEMARK OFFICE
CERTIFICATE OF CORRECTION

PATENT NO. : 3,991,553
DATED : November 16, 1976
INVENTOR(S) : John M. Bergey; Arthur H. O'Connor It is certified that error appears in the above-identified patent and that said Letters Patent are hereby corrected as shown below:

Column 2, line 60, after "date" insert --demand--.

Column 4, line 28, before "122" insert --120--.

Column 6, line 30, "at" should be --as--.

Signed and Sealed this

Nineteenth Day of April 1977

[SEAL]

Attest:

RUTH C. MASON
*Attesting Officer*

C. MARSHALL DANN
*Commissioner of Patents and Trademarks*